(12) United States Patent
Lai et al.

(10) Patent No.: US 12,549,171 B2
(45) Date of Patent: Feb. 10, 2026

(54) RING OSCILLATOR WITH AN OVERSTRESS SOLUTION

(71) Applicant: MEDIATEK INC., Hsinchu (TW)

(72) Inventors: Chin-Kai Lai, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/741,134

(22) Filed: Jun. 12, 2024

(65) Prior Publication Data

US 2024/0421811 A1  Dec. 19, 2024

Related U.S. Application Data

(60) Provisional application No. 63/508,941, filed on Jun. 19, 2023.

(51) Int. Cl.
*H03K 17/08* (2006.01)
*H03K 3/03* (2006.01)
*H03K 19/20* (2006.01)

(52) U.S. Cl.
CPC ........... *H03K 17/08* (2013.01); *H03K 3/0315* (2013.01); *H03K 19/20* (2013.01)

(58) Field of Classification Search
CPC ....... H03K 17/08; H03K 3/0315; H03K 19/20
USPC ....... 331/57, 185, 74, 135; 327/264
See application file for complete search history.

(56) References Cited

U.S. PATENT DOCUMENTS 4,257,035 A * 3/1981 Yen .................. G08B 3/10
331/47

FOREIGN PATENT DOCUMENTS

CN  102739197 B  8/2015

OTHER PUBLICATIONS

Griffith, D., et al.; "A 190nW 33KHz RC oscillator with ±0.21% temperature stability and 4ppm long-term stability;" ISSCC 2014 / Session 17 / Analog Techniques / 17.8; Feb. 2014; pp. 299-301.
Choi, W., et al.; "A Compact Resistor-Based CMOS Temperature Sensor With an Inaccuracy of 0.12 °C (3 Σ ) and a Resolution FoM of 0.43 pJ • K 2 in 65-nm CMOS;" IEEE Journal of Solid-State Circuits, vol. 53, No. 12; Dec. 2018; pp. 3356-3367.
Park, J., et al.; "A 0.65V 1316µm2 Fully Synthesizable Digital Temperature Sensor Using Wire Metal Achieving 0.16nJ.%2 -Accuracy FoM in 5nm FinFET CMOS;" ISSCC 2022 / Session 13 / Digital Techniques for Clocking, Variation Tolerance and Power Management / 13.6; Feb. 2022.

* cited by examiner

*Primary Examiner* — Arnold M Kinkead
(74) *Attorney, Agent, or Firm* — McClure, Qualey & Rodack, LLP (57) ABSTRACT

A ring oscillator with an overstress solution is shown, which includes a plurality of oscillation units connected in a ring, and two capacitors. The first capacitor has a first terminal and a second terminal that are respectively coupled to a first node and a second node of the ring. The second node is an input terminal of a first-stage oscillation unit. The first node is an output terminal of a later-stage oscillation unit. The first signal at the first node is generated by inverting an input signal coupled to the input terminal of the first-stage oscillation unit an even number of times. The second capacitor is coupled between the second node and the ground terminal.

25 Claims, 11 Drawing Sheets

RING OSCILLATOR WITH AN OVERSTRESS SOLUTION

CROSS REFERENCE TO RELATED APPLICATIONS

This application claims the benefit of U.S. Provisional Application No. 63/508,941, filed Jun. 19, 2023, the entirety of which is incorporated by reference herein.

BACKGROUND OF THE INVENTION

Field of the Invention

The present invention relates to a ring oscillator.

Description of the Related Art

A ring oscillator is implemented by a plurality of oscillation units which are connected in a ring. An oscillation unit may be an inverter, a NAND gate, and so on. To start oscillation, a voltage change needs to be supplied to the input terminal of a first-stage oscillation unit of the ring. If the voltage change is too high, it may break the MOS transistors in the first-stage oscillation unit. An overstress solution, therefore, is called for.

BRIEF SUMMARY OF THE INVENTION

A ring oscillator with an overstress solution includes a plurality of oscillation units connected in a ring, a first capacitor, and a second capacitor. The first capacitor has a first terminal coupled to a first node of the ring, and a second terminal coupled to a second node of the ring. The second node is the input terminal of a first-stage oscillation unit, which receives an input signal. The first node is an output terminal of a later-stage oscillation unit. A first signal at the first node is generated by inverting the input signal an even number of times. The second capacitor is coupled between the second node and the ground terminal. In an exemplary embodiment, the oscillation units are powered by the power supply voltage. The second capacitor suppresses a voltage change that the first capacitor couples to the second node and thereby the input voltage is controlled so that it does not exceed the power supply voltage.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description lists various embodiments of the present disclosure, but is not intended to limit thereto. The actual scope of the disclosure should be defined according to the scope of the application.

Figure 1A:
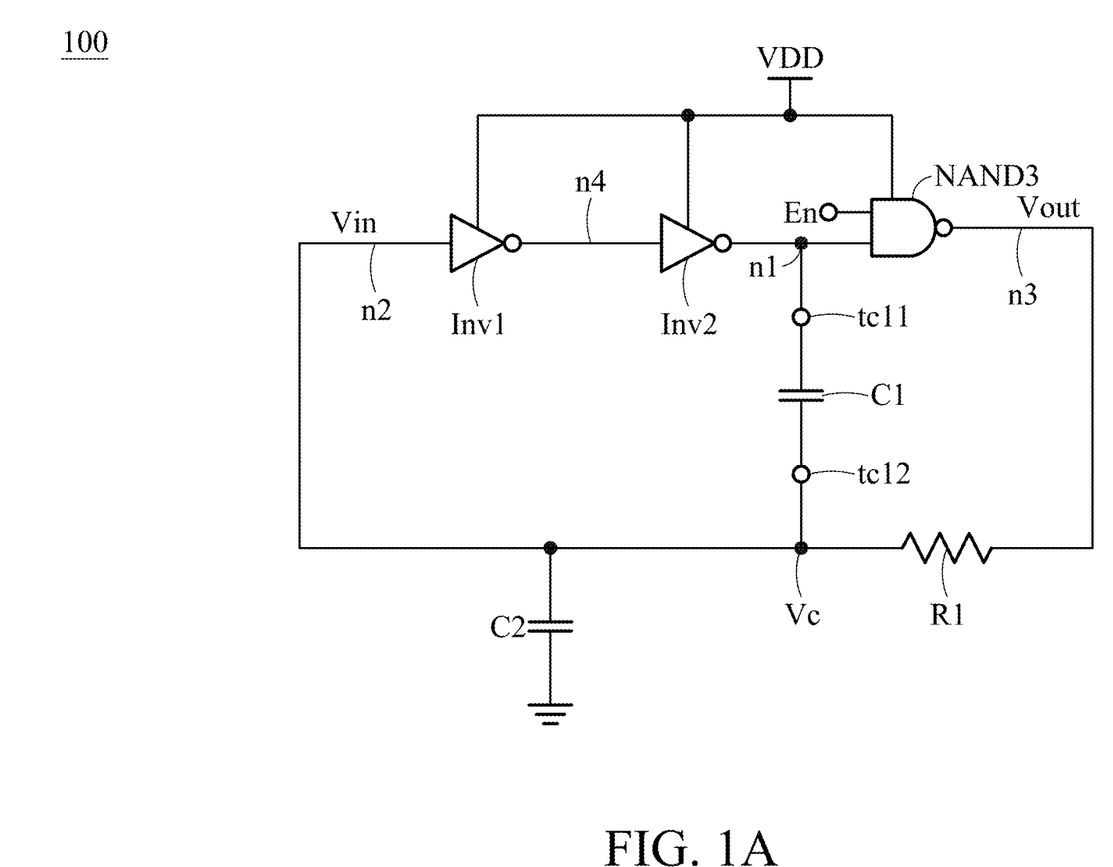
FIG. 1A shows a ring oscillator 100 in accordance with an exemplary embodiment of the disclosure.

FIG. 1A shows a ring oscillator 100 in accordance with an exemplary embodiment of the disclosure, which includes a plurality of oscillation units connected in a ring.

In FIG. 1A, the ring is formed by three stages of oscillation units. The first-stage oscillation unit is implemented by a first inverter Inv1, whose output terminal is connected to an input terminal of a second inverter Inv2 that implements a later-stage oscillation unit. The output terminal of the later-stage oscillation unit (Inv2) is coupled to a final-stage oscillation unit. The final-stage oscillation unit is a NAND gate NAND3. The generated output signal Vout is coupled back to the first-stage oscillation unit (Inv1) to provide an input signal Vin to the input terminal of the first-stage oscillation unit (Inv1).

In the ring structure, the output terminal of the later-stage oscillation unit (Inv2) is regarded as a first node n1, and the input terminal of the first-stage oscillation unit (Inv1) is regarded as a second node n2. A first signal (Vn1) at the first node n1 is generated by inverting the input signal Vin an even number of times (referring to Inv1 and Inv2). The NAND gate NAND3 has a first input terminal coupled to the first node n1, a second input terminal receiving an enable signal En for activation of the ring oscillator 100, and an output terminal that is a third node n3. The connection node between the first inverter Inv1 and the second inverter Inv2 is nabbed a fourth node n4.

Between the first node n1 and the second node n2, there is a first capacitor C1. The first capacitor C1 has a first terminal tc11 coupled to the first node n1, and a second terminal tc12 coupled to the second node n2. The ring oscillator 100 specially provides a second capacitor C2 coupled between the second node n2 and the ground terminal. The rising/falling voltage change at the first node n1 is coupled to the second terminal tc12 of the first capacitor C1 to affect a critical voltage Vc at the second terminal tc12 of the first capacitor C1. The second capacitor C2 is provided to suppress the voltage change that the first capacitor C1 couples to the critical voltage Vc, and thereby the input signal Vin is controlled so that it does not exceed the power supply voltage VDD supplied to the oscillation units Inv1, Inv2, and NAND3. The overstress problem, therefore, is solved.

The ring oscillator 100 further includes a first resistor R1 between the third node n3 and the second terminal tc12 of the first capacitor C1. A third signal (Vn3) at the third node n3 is generated by inverting the first signal (Vn1) an odd number of times (e.g., by NAND3). Thus, the first resistor R1 provides a charging/discharging path for the critical voltage Vc, to keep oscillation of the ring oscillator 100.

Figure 1B:
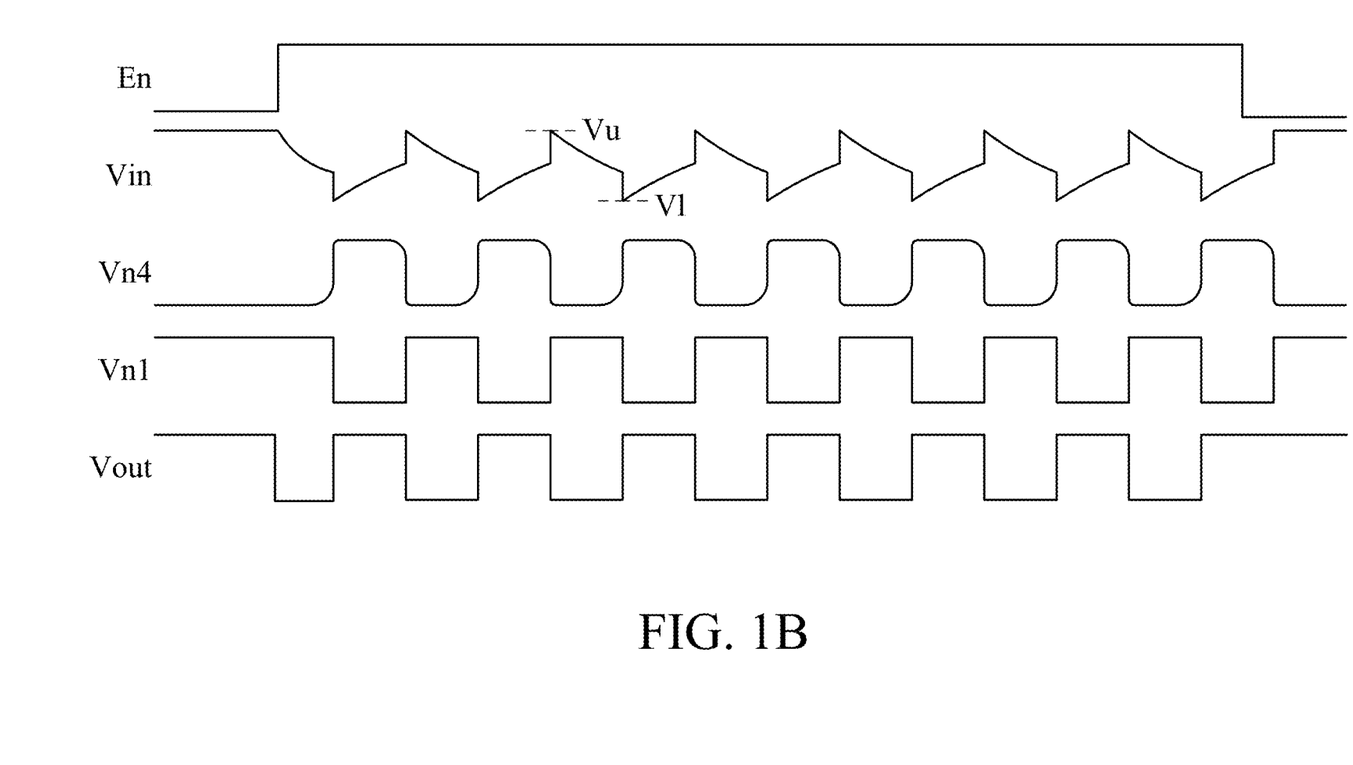
FIG. 1B illustrates waveforms of the signals of the ring oscillator 100.

FIG. 1B illustrates waveforms of the signals of the ring oscillator 100. As activated by the enable signal En, oscillation starts. The output signal Vout falls to the low voltage. Through the discharging path (R1), the critical voltage Vc gradually decreases so as the input signal Vin. Then a fourth signal Vn4 at the fourth node n4 (an output terminal of the first inverter Inv1) is high. The second inverter Inv2, therefore, outputs the low state first signal Vn1 at the first node n1. The first capacitor couples the falling change of the first signal Vn1 to the critical voltage Vc. Because of the second capacitor C2, the falling change coupled to the critical voltage Vc is suppressed. The input signal Vin is protected from being lower than a lower limit Vl. Based on the same idea, the rising change coupled to the critical voltage Vc is also suppressed. The input signal Vin is protected from being greater than an upper limit Vu. In this way, the input signal Vin is limited between Vl and Vu, and the overstress problem is solved.

Figure 2A:
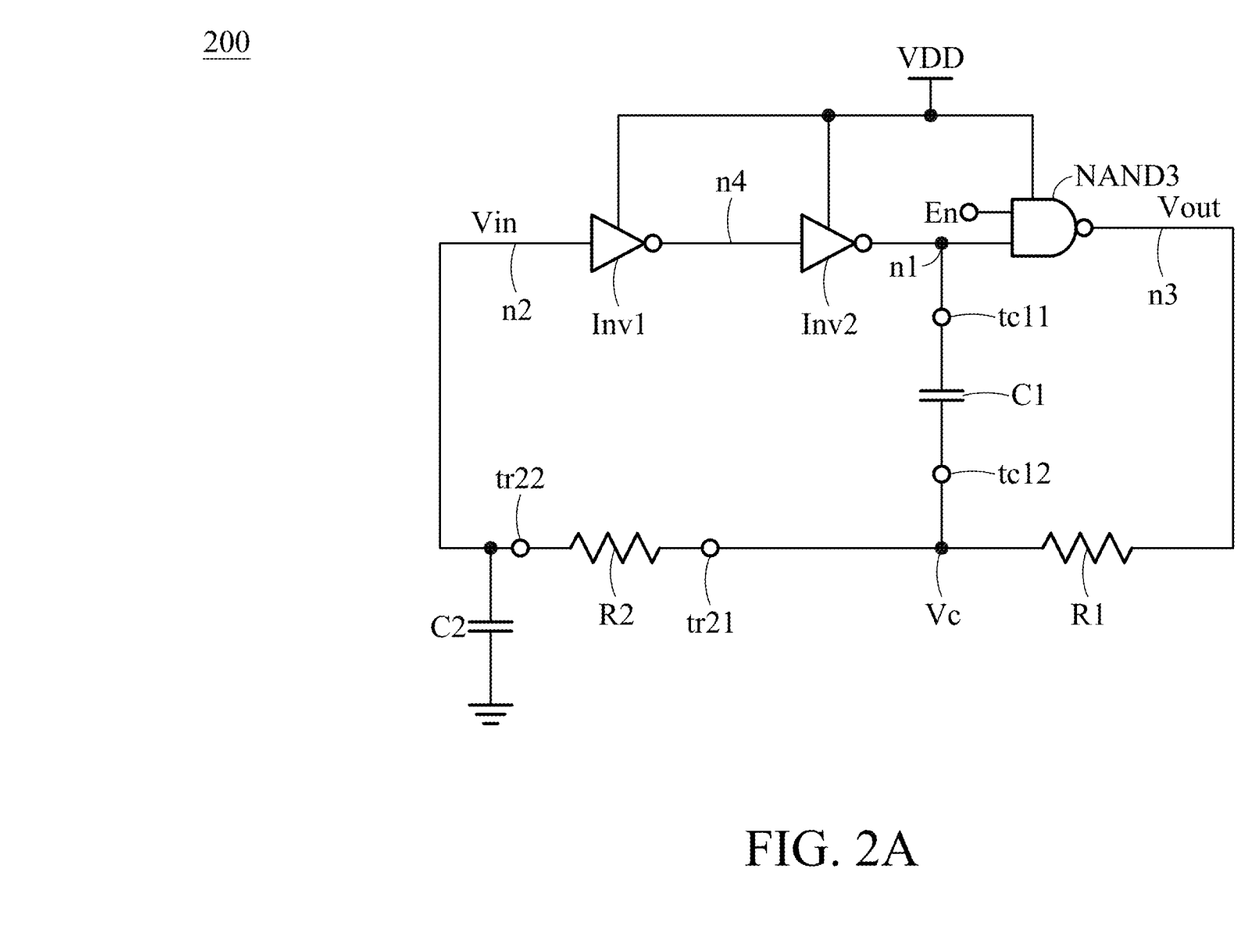
FIG. 2A illustrates a ring oscillator 200 in accordance with another exemplary embodiment of the disclosure.

FIG. 2A illustrates a ring oscillator 200 in accordance with another exemplary embodiment of the disclosure. In comparison with the ring oscillator 100 of FIG. 1A, the ring oscillator 200 of FIG. 2 further includes a second resistor R2. The second resistor R2 has a first terminal tr21 coupled to the second terminal tc12 of the first capacitor C2, and a second terminal tr22 coupled to the second node n2. The second capacitor C2 is connected to the second terminal tr22 of the second resistor R2 to form a low-pass filter. The voltage change that the first capacitor C1 couples to the critical voltage Vc is suppressed by the low-pass filter.

Figure 2B:
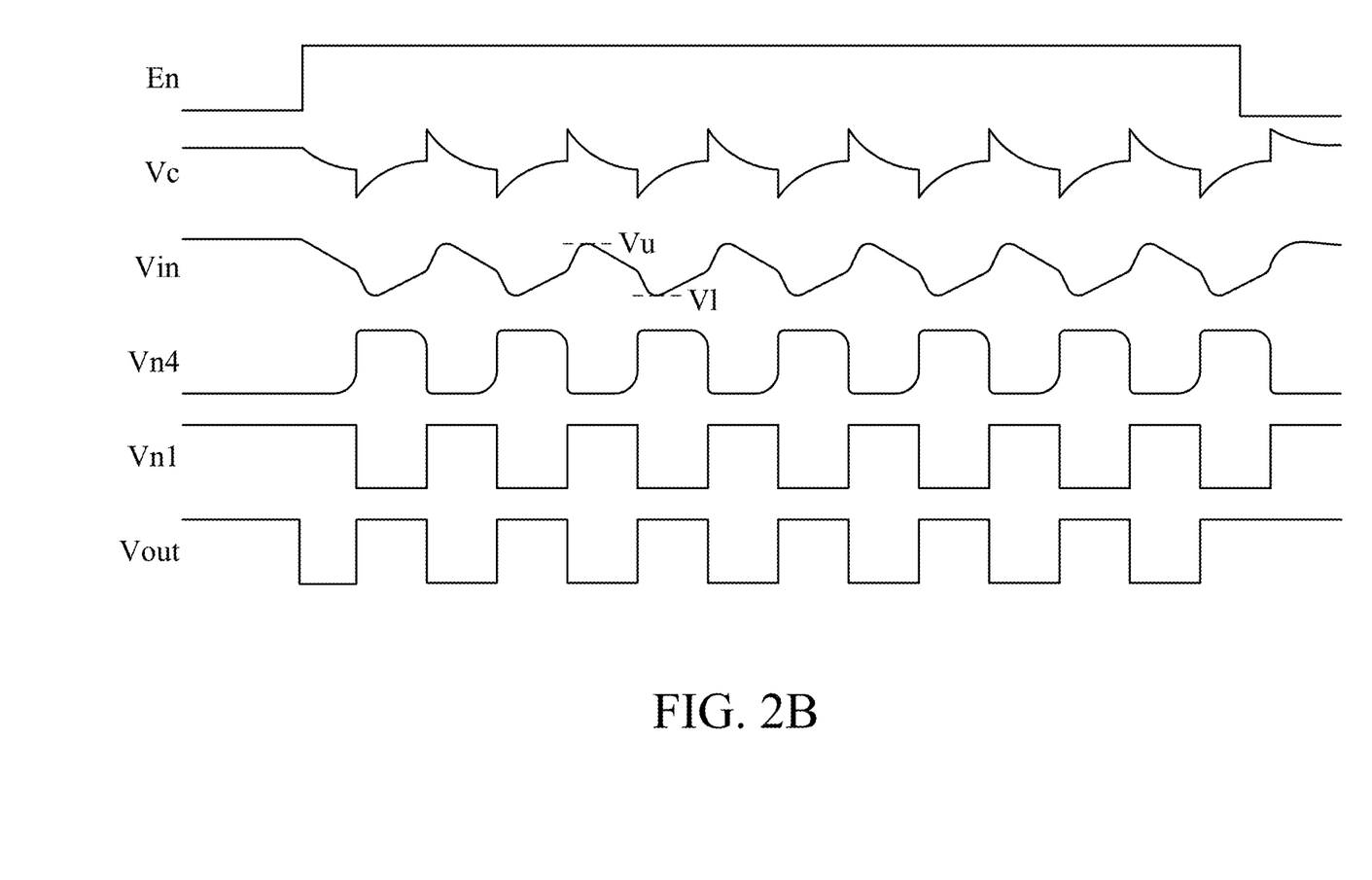
FIG. 2B illustrates waveforms of the signals of the ring oscillator 200.

FIG. 2B illustrates waveforms of the signals of the ring oscillator 200. Referring to the critical voltage Vc and the input signal Vin at the second node n2 of the ring 200, the low-pass filter formed by R2 and C2 suppresses the undesired glitches. The input signal Vin is limited between Vl and Vu, and the overstress problem is solved.

There are variants of the ring oscillator 100.

Figure 3:
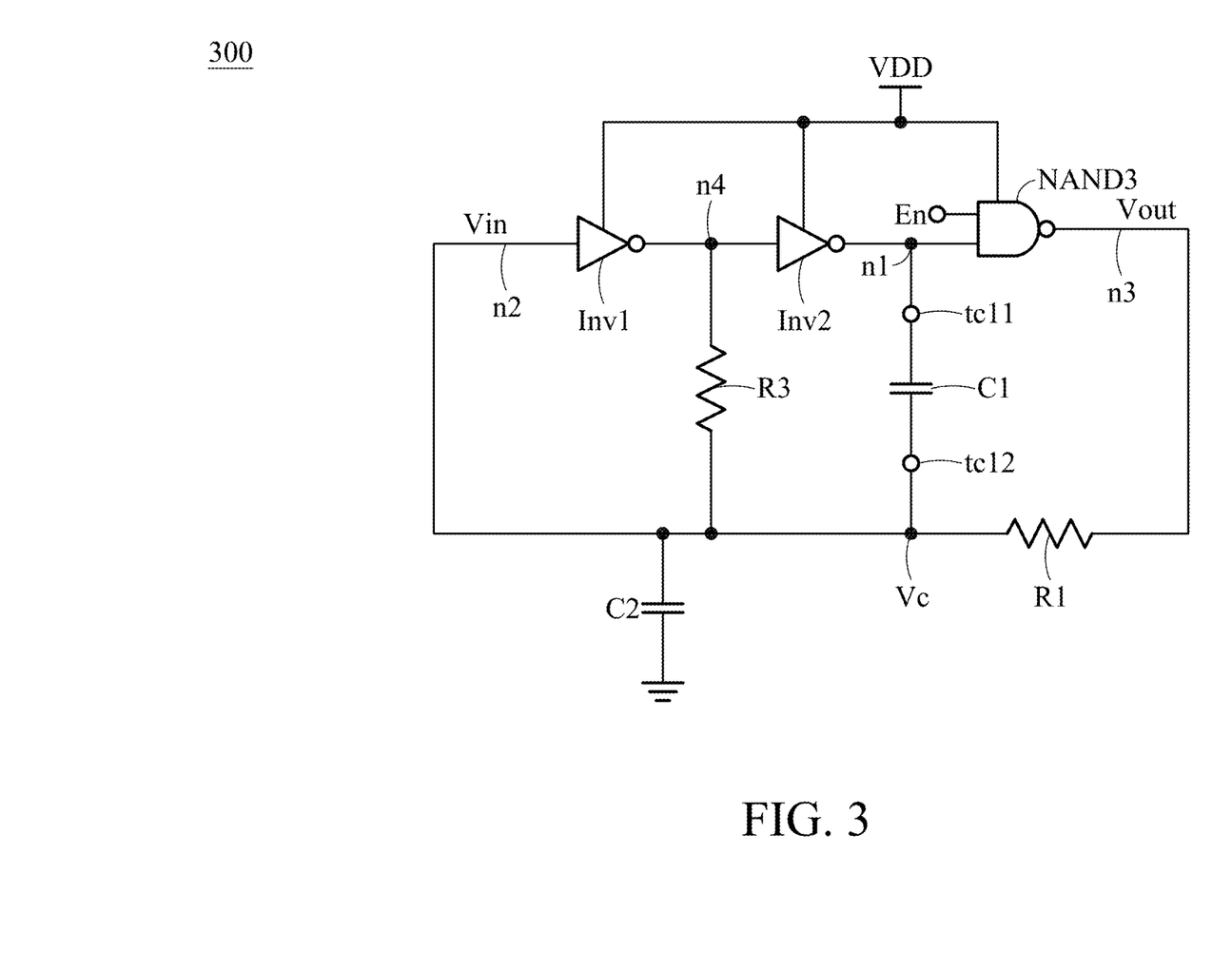
FIG. 3 depicts a ring oscillator 300 in accordance with another exemplary embodiment of the disclosure.

FIG. 3 depicts a ring oscillator 300 in accordance with another exemplary embodiment of the disclosure. In comparison with the ring oscillator 100, the ring oscillator 300 further includes a third resistor R3 coupled between a second terminal tc12 of the first capacitor C1 and the fourth node n4 of the ring. In some other examples wherein the ring is formed by more than 3 stages of oscillation units, the fourth node n4 is between the first-stage oscillation unit and the later-stage oscillation unit, and a fourth signal (Vn4) at the fourth node n4 is generated by inverting the input signal Vin an odd number of times. The third resistor R3 is another charging/discharging path for the critical voltage Vc.

Figure 4:
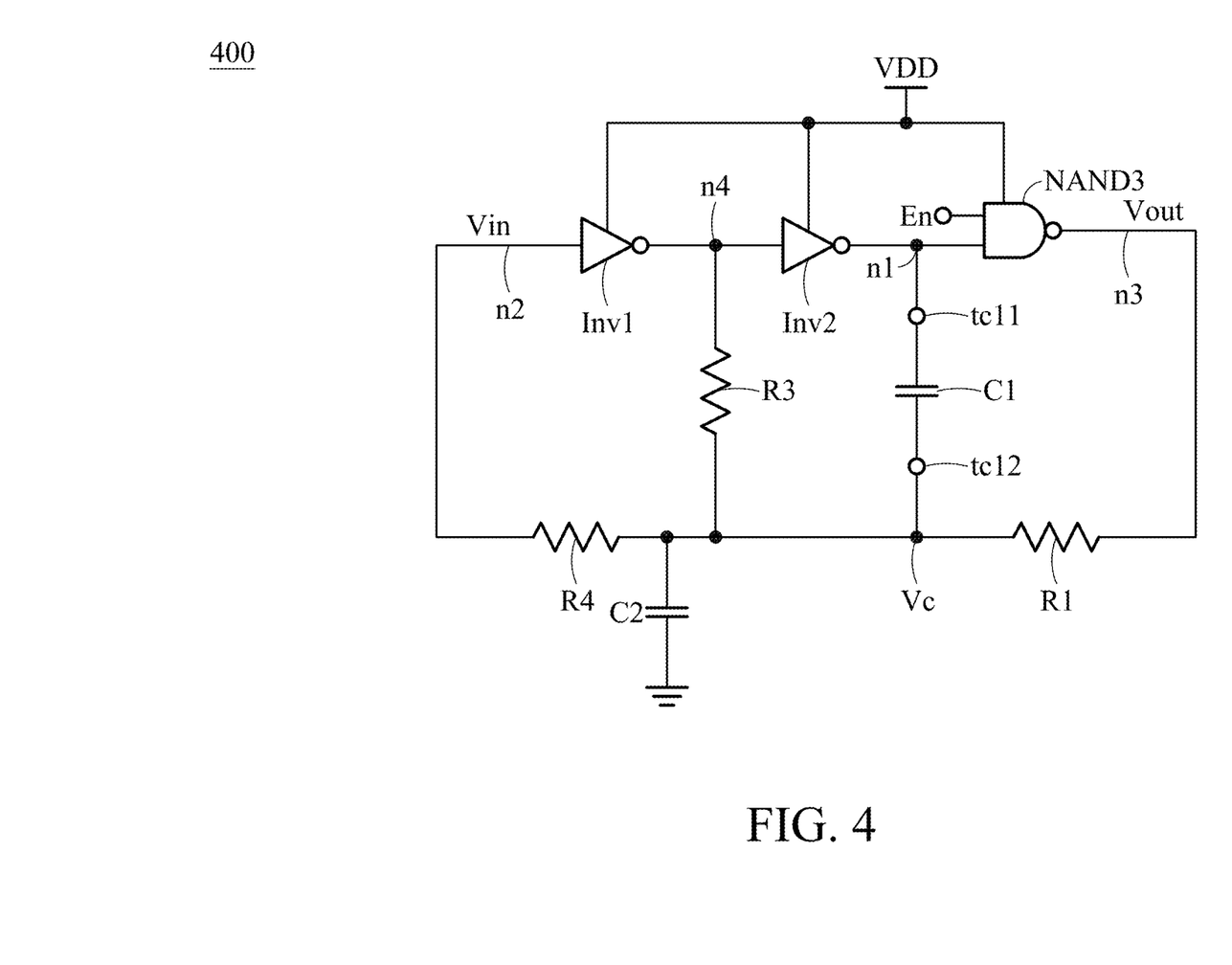
FIG. 4 depicts a ring oscillator 400 in accordance with another exemplary embodiment of the disclosure.

FIG. 4 depicts a ring oscillator 400 in accordance with another exemplary embodiment of the disclosure. In comparison with the ring oscillator 300, the ring oscillator 400 further includes a fourth resistor R4 coupled between the second node n2 and the second capacitor C2. The fourth resistor R4 is provided to control the current in the ring.

Figure 5:
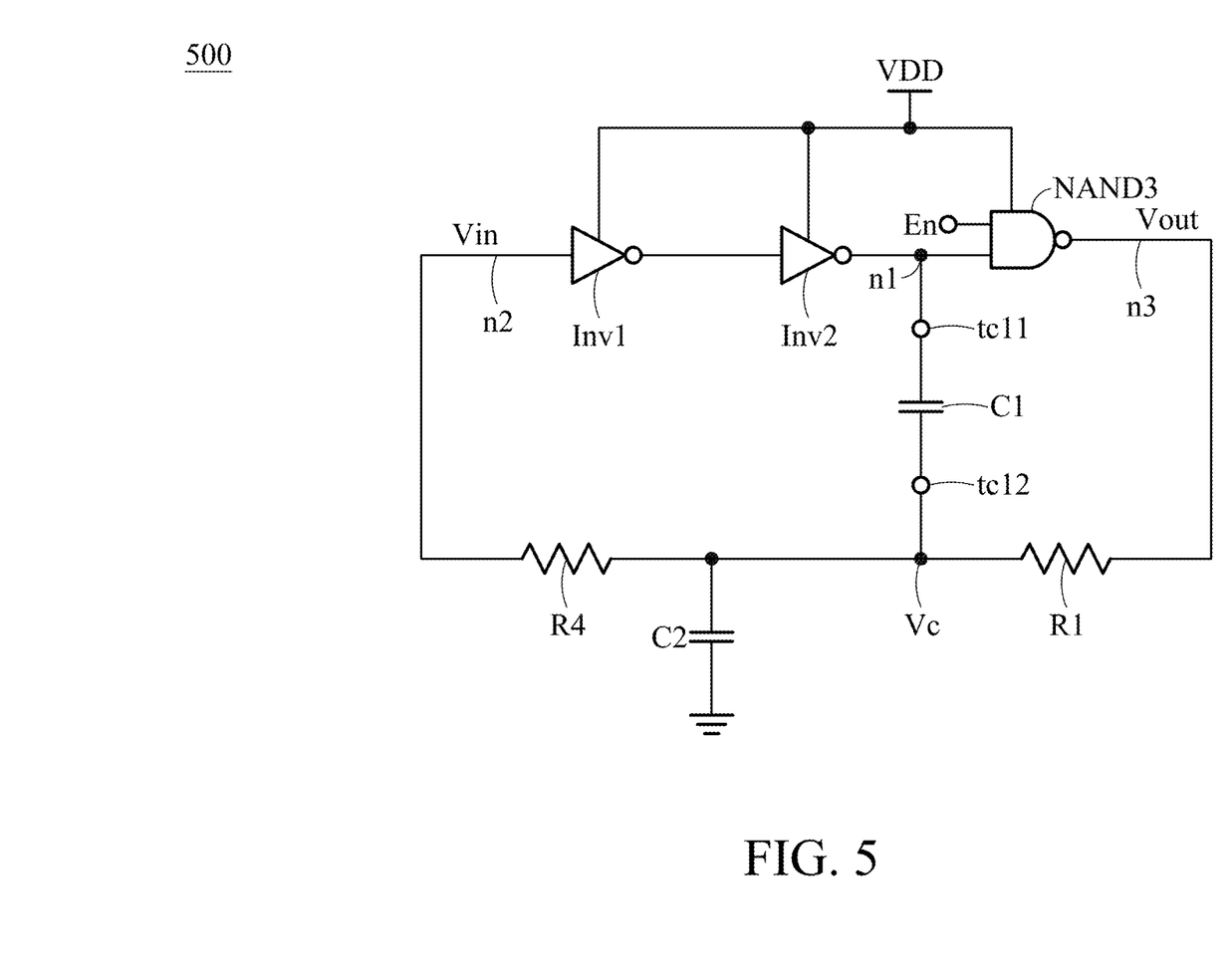
FIG. 5 depicts a ring oscillator 500 in accordance with another exemplary embodiment of the disclosure.

FIG. 5 depicts a ring oscillator 500 in accordance with another exemplary embodiment of the disclosure. In comparison with the ring oscillator 400, the ring oscillator 500 does not use the third resistor R3.

There are variants of the low-pass filter design of the ring oscillator 200.

Figure 6:
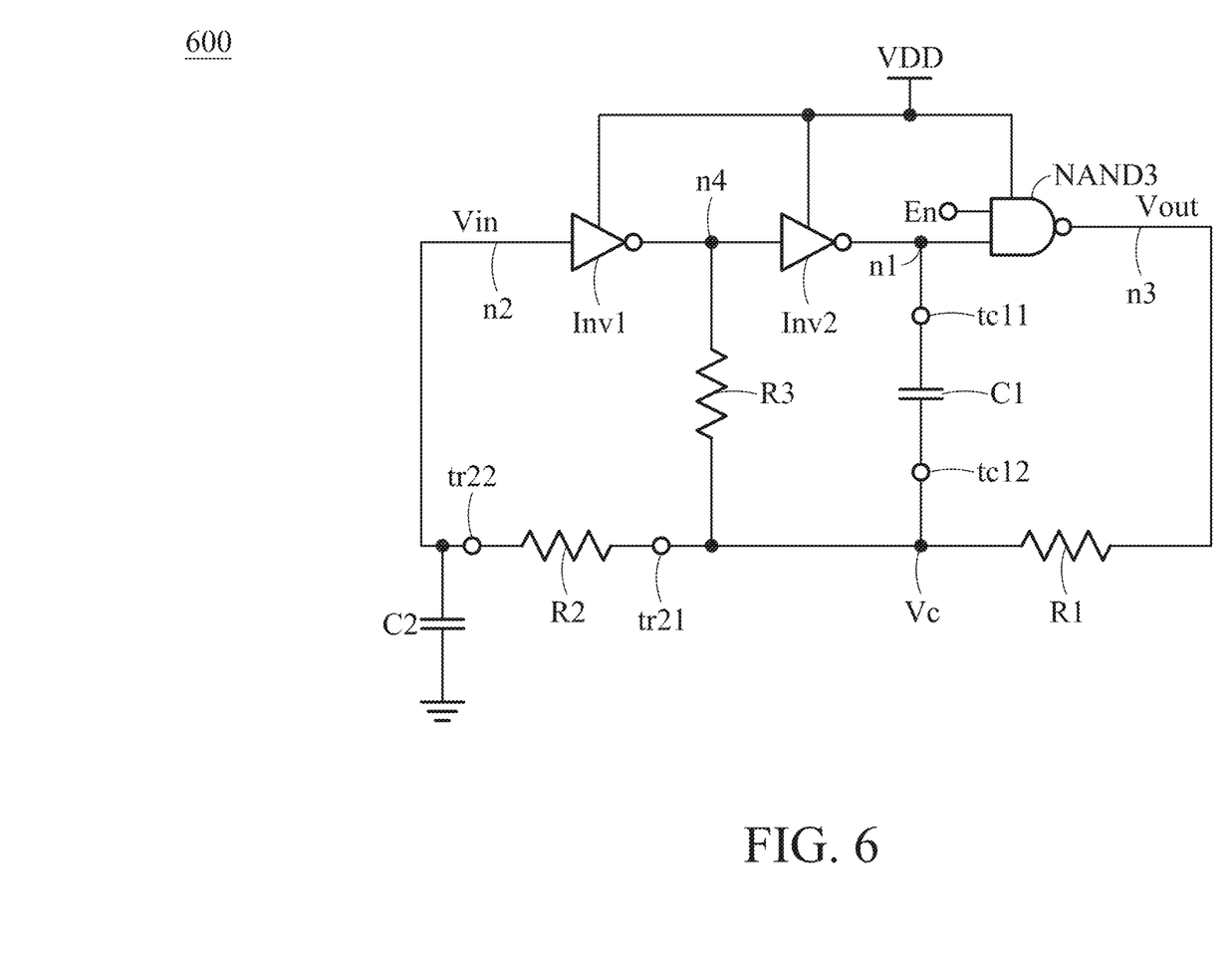
FIG. 6 depicts a ring oscillator 600 in accordance with another exemplary embodiment of the disclosure.

FIG. 6 depicts a ring oscillator 600 in accordance with another exemplary embodiment of the disclosure. In comparison with the ring oscillator 200 of FIG. 2A, the ring oscillator 600 uses the aforementioned third resistor R3 between the second terminal tc12 of the first capacitor C1 and the fourth node n4 of the ring.

Note that the number of oscillation units form a ring is not limited to 3.

Figure 7:
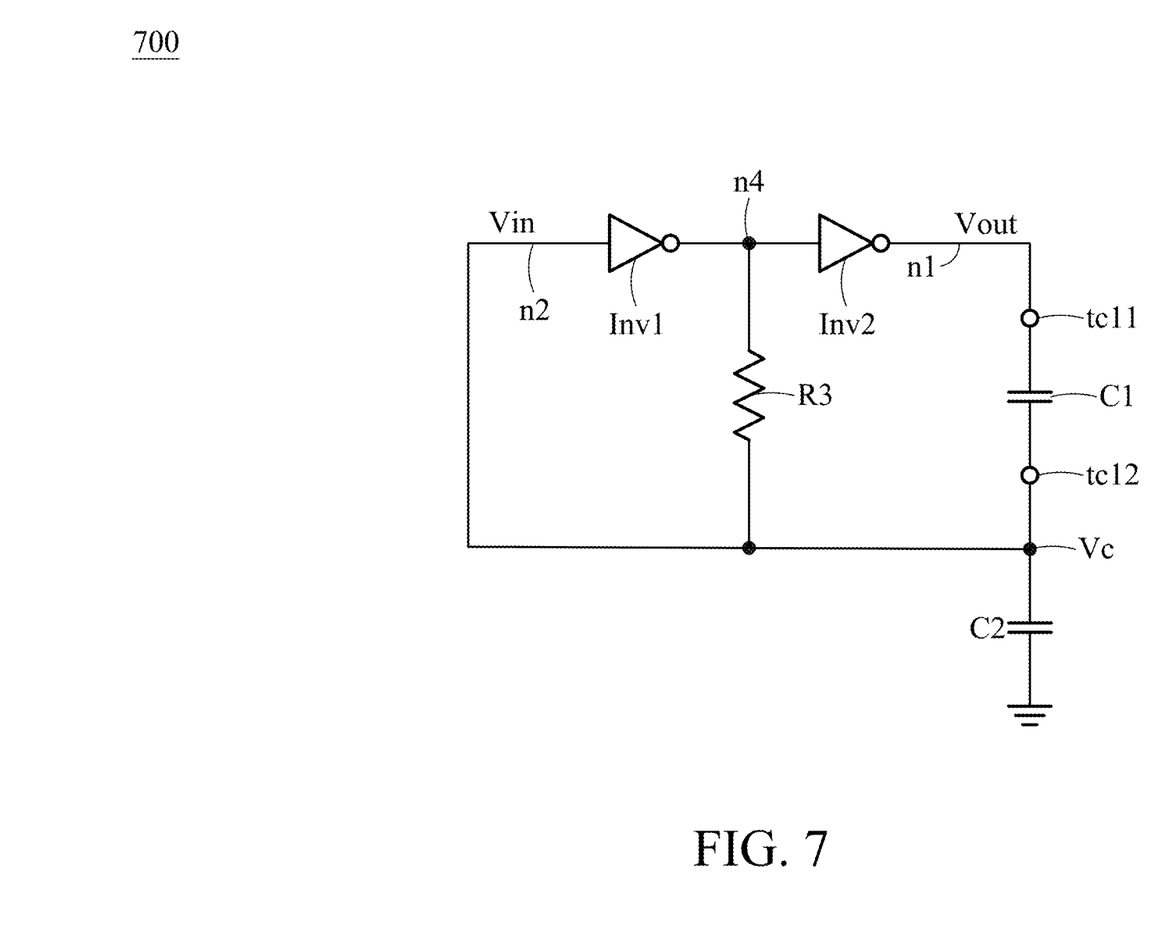
FIG. 7 depicts a ring oscillator 700 using two oscillation units Inv1 and Inv2 to form a ring.

FIG. 7 depicts a ring oscillator 700 using two oscillation units Inv1 and Inv2 to form a ring. The first capacitor C1 is coupled between the first node n1 and the second node n2 of the ring. The third resistor R3 provides a charging/discharging path for the critical voltage Vc. The second capacitor C2 suppresses the voltage change that the first capacitor C1 couples to the critical voltage Vc.

Figure 8:
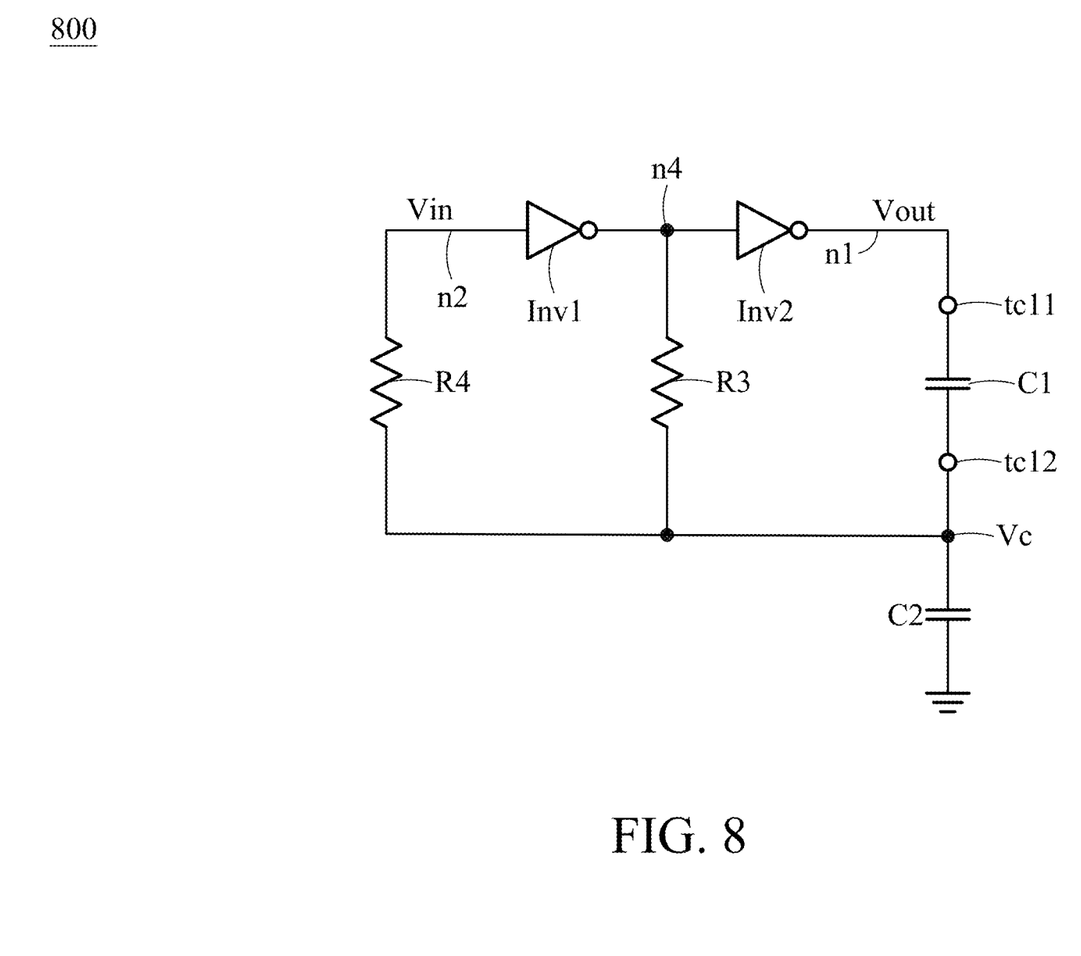
FIG. 8 depicts a ring oscillator 800 in accordance with another exemplary embodiment of the disclosure.

FIG. 8 depicts a ring oscillator 800 in accordance with another exemplary embodiment of the disclosure. In comparison with the ring oscillator 700, the ring oscillator 800 further includes a fourth resistor R4 coupled between the second node n2 and the second capacitor C2. The fourth resistor R4 is provided to control the current in the ring.

Figure 9:
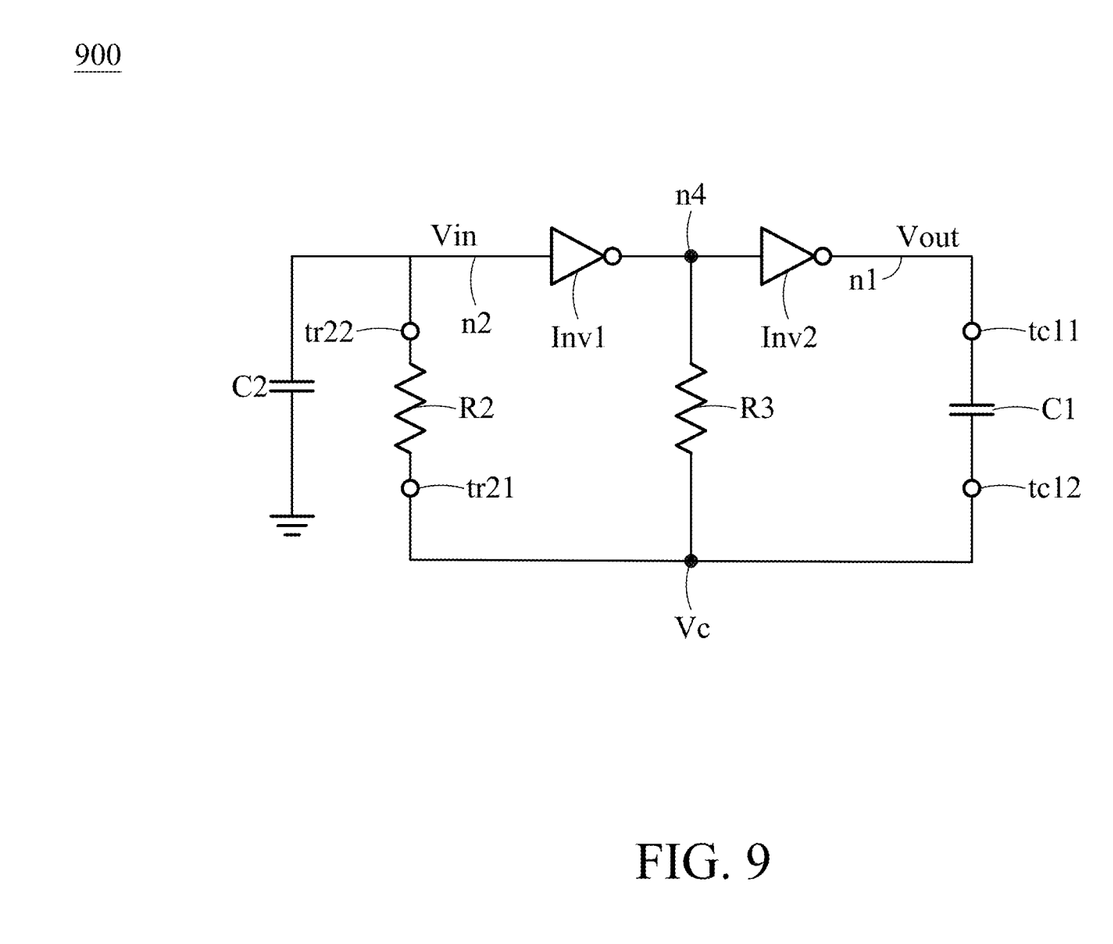
FIG. 9 illustrates a ring oscillator 900 in accordance with another exemplary embodiment of the disclosure.

FIG. 9 illustrates a ring oscillator 900 in accordance with another exemplary embodiment of the disclosure. It is another low-pass filtering solution. The ring oscillator 900 uses two oscillation units Inv1 and Inv2 to form a ring. The first capacitor C1 couples the voltage change occurred on the first node n1 to the critical voltage Vc. Through the low-pass filter formed by R2 and C2, the critical voltage Vc is coupled to the second node n2 as the input signal Vin for the ring 900. The third resistor R3 provides a charging/discharging path for the critical voltage Vc.

In some exemplary embodiments, the proposed ring oscillator uses metal resistors to implement the aforementioned resistors R1~R4. Metal resistors are sensitive to the environmental temperature. The aforementioned ring oscillators may be used as temperature sensors.

Any ring oscillator using a capacitor (C1) and its accompanying resistors (R1 or/and R3) to generate signal oscillation, and including a capacitor (C2) for suppression of the overstress voltage is within the scope of the disclosure. The components depicted in the figures may be directed connected to each other as shown in the figures. In some exemplary embodiments, additional electric components may be inserted between the depicted components depending on the design requirements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A ring oscillator, comprising:
a plurality of oscillation units, connected in a ring;
a first capacitor, having a first terminal coupled to a first node of the ring, and a second terminal coupled to a second node of the ring, wherein the second node is an input terminal of a first-stage oscillation unit of the plurality of oscillation units, the first node is an output terminal of a later-stage oscillation unit of the plurality of oscillation units, and a first signal at the first node is generated by inverting an input signal, coupled to the input terminal of the first-stage oscillation unit an even number of times; and
a second capacitor, coupled between the second node and a ground terminal;
wherein:
the oscillation units are powered by a power supply voltage; and the second capacitor suppresses a voltage change that the first capacitor couples to the second node and thereby the input signal is controlled so that it does not exceed the power supply voltage.

2. The ring oscillator as claimed in claim 1, further comprising:
a first resistor, coupled between a third node of the ring and the second terminal of the first capacitor,
wherein a third signal at the third node is generated by inverting the first signal an odd number of times.

3. The ring oscillator as claimed in claim 2, wherein: the plurality of oscillation units include a first inverter, a second inverter, and a NAND gate; the first inverter is the first-stage oscillation unit; the second inverter is the later-stage oscillation unit, and has an input terminal coupled to an output terminal of the first-stage oscillation unit; and the NAND gate has a first input terminal coupled to the first node, a second input terminal receiving an enable signal for activation of the ring oscillator, and an output terminal that is the third node.

4. The ring oscillator as claimed in claim 2, further comprising:
a second resistor, having a first terminal coupled to the second terminal of the first capacitor, and a second terminal coupled to the second node;
wherein the second capacitor is connected to the second terminal of the second resistor to form a low-pass filter.

5. The ring oscillator as claimed in claim 4, wherein: the plurality of oscillation units include a first inverter, a second inverter, and a NAND gate; the first inverter is the first-stage oscillation unit; the second inverter is the later-stage oscillation unit, and has an input terminal coupled to an output terminal of the first-stage oscillation unit; and the NAND gate has a first input terminal coupled to the first node, a second input terminal receiving an enable signal for activation of the ring oscillator, and an output terminal that is the third node.

6. The ring oscillator as claimed in claim 2, further comprising:
a third resistor, coupled between a second terminal of the first capacitor and a fourth node of the ring;
wherein the fourth node is between the first-stage oscillation unit and the later-stage oscillation unit, and a fourth signal at the fourth node is generated by inverting the input signal an odd number of times.

7. The ring oscillator as claimed in claim 6, wherein: the plurality of oscillation units include a first inverter, a second inverter, and a NAND gate; the first inverter is the first-stage oscillation unit including an output terminal that is the fourth node; the second inverter is the later-stage oscillation unit, and has an input terminal coupled to the fourth node; the NAND gate has a first input terminal coupled to the first node, a second input terminal receiving an enable signal for activation of the ring oscillator, and an output terminal that is the third node.

8. The ring oscillator as claimed in claim 6, further comprising:
a fourth resistor, coupled between the second node and the second capacitor.

9. The ring oscillator as claimed in claim 8, wherein: the plurality of oscillation units include a first inverter, a second inverter, and a NAND gate; the first inverter is the first-stage oscillation unit including an output terminal that is the fourth node; the second inverter is the later-stage oscillation unit, and has an input terminal coupled to the fourth node; the NAND gate has a first input terminal coupled to the first node, a second input terminal receiving an enable signal for activation of the ring oscillator, and an output terminal that is the third node.

10. The ring oscillator as claimed in claim 2, further comprising:
a fourth resistor, coupled between the second node and the second capacitor.

11. The ring oscillator as claimed in claim 10, wherein: the plurality of oscillation units include a first inverter, a second inverter, and a NAND gate; the first inverter is the first-stage oscillation unit; the second inverter is the later-stage oscillation unit, and has an input terminal coupled to an output terminal of the first-stage oscillation unit; the NAND gate has a first input terminal coupled to the first node, a second input terminal receiving an enable signal for activation of the ring oscillator, and an output terminal that is the third node.

12. The ring oscillator as claimed in claim 4, further comprising:
a third resistor, coupled between a second terminal of the first capacitor and a fourth node of the ring;
wherein the fourth node is between the first-stage oscillation unit and the later-stage oscillation unit, and a fourth signal at the fourth node is generated by inverting the input signal an odd number of times.

13. The ring oscillator as claimed in claim 12, wherein: the plurality of oscillation units include a first inverter, a second inverter, and a NAND gate; the first inverter is the first-stage oscillation unit including an output terminal that is the fourth node; the second inverter is the later-stage oscillation unit, and has an input terminal coupled to the fourth node; the NAND gate has a first input terminal coupled to the first node, a second input terminal receiving an enable signal for activation of the ring oscillator, and an output terminal that is the third node.

14. The ring oscillator as claimed in claim 1, further comprising:
a third resistor, coupled between a second terminal of the first capacitor and a fourth node of the ring;
wherein the fourth node is between the first-stage oscillation unit and the later-stage oscillation unit, and a fourth signal at the fourth node is generated by inverting the input signal an odd number of times.

15. The ring oscillator as claimed in claim 14, wherein: the plurality of oscillation units include a first inverter and a second inverter; the first inverter is the first-stage oscillation unit including an output terminal that is the fourth node; and the second inverter is the later-stage oscillation unit, and has an input terminal coupled to the fourth node.

16. The ring oscillator as claimed in claim 14, further comprising:
a fourth resistor, coupled between the second node and the second capacitor.

17. The ring oscillator as claimed in claim 16, wherein: the plurality of oscillation units include a first inverter and a second inverter; the first inverter is the first-stage oscillation unit including an output terminal that is the fourth node; and the second inverter is the later-stage oscillation unit, and has an input terminal coupled to the fourth node.

18. The ring oscillator as claimed in claim 14, further comprising:
a second resistor, having a first terminal coupled to the second terminal of the first capacitor, and a second terminal coupled to the second node;
wherein the second capacitor is connected to the second terminal of the second resistor to form a low-pass filter.

19. The ring oscillator as claimed in claim 18, wherein: the plurality of oscillation units include a first inverter and a second inverter; the first inverter is the first-stage oscillation unit including an output terminal that is the fourth node; and the second inverter is the later-stage oscillation unit, and has an input terminal coupled to the fourth node.

20. A ring oscillator, comprising: a plurality of oscillation units, connected in a ring; a first capacitor, having a first terminal coupled to a first node of the ring, and a second terminal coupled to a second node of the ring, wherein the second node is an input terminal of a first-stage oscillation unit of the plurality of oscillation units, the first node is an output terminal of a later-stage oscillation unit of the plurality of oscillation units, and a first signal at the first node is generated by inverting an input signal, coupled to the input terminal of the first-stage oscillation unit an even number of times; and a second capacitor, coupled between the second node and a ground terminal; and a first resistor, coupled between a second terminal of the first capacitor and a third node of the ring; wherein the third node is between the first-stage oscillation unit and the later-stage oscillation unit, and a fourth signal at the third node is generated by inverting the input signal an odd number of times.

21. The ring oscillator as claimed in claim 20, wherein:
the oscillation units include a first inverter and a second inverter;
the first inverter is the first-stage oscillation unit including an output terminal that is the fourth node; and
the second inverter is the later-stage oscillation unit, and has an input terminal coupled to the fourth node.

22. The ring oscillator as claimed in claim 20, further comprising: a second resistor, coupled between the second node and the second capacitor.

23. The ring oscillator as claimed in claim 22, wherein:
the oscillation units include a first inverter and a second inverter;
the first inverter is the first-stage oscillation unit including an output terminal that is the fourth node; and
the second inverter is the later-stage oscillation unit, and has an input terminal coupled to the fourth node.

24. The ring oscillator as claimed in claim 20, further comprising: a third resistor, having a first terminal coupled to the second terminal of the first capacitor, and a second terminal coupled to the second node; wherein the second capacitor is connected to the second terminal of the third resistor to form a low-pass filter.

25. The ring oscillator as claimed in claim 24, wherein:
the oscillation units include a first inverter and a second inverter;
the first inverter is the first-stage oscillation unit including an output terminal that is the fourth node; and
the second inverter is the later-stage oscillation unit, and has an input terminal coupled to the fourth node.

* * * * *